US009655233B2

(12) United States Patent
Nakagawa

(10) Patent No.: US 9,655,233 B2

(45) Date of Patent: May 16, 2017

(54) WIRING BOARD TO MOUNT A SEMICONDUCTOR ELEMENT

(71) Applicant: KYOCERA Circuit Solutions, Inc., Yasu-shi, Shiga (JP)

(72) Inventor: Yoshihiro Nakagawa, Osaka (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 46 days.

(21) Appl. No.: 14/553,197

(22) Filed: Nov. 25, 2014

(65) Prior Publication Data

US 2015/0156875 A1 Jun. 4, 2015

(30) Foreign Application Priority Data

Nov. 29, 2013 (JP) ................................ 2013-247003

(51) Int. Cl.

*H05K 1/11* (2006.01)
*H05K 1/02* (2006.01)
*H05K 3/46* (2006.01)

(52) U.S. Cl.

CPC ......... *H05K 1/0245* (2013.01); *H05K 1/0251* (2013.01); *H05K 1/0298* (2013.01); *H05K 3/4644* (2013.01)

(58) Field of Classification Search

CPC ....... H05K 1/15; H05K 1/0215; H05K 1/0298

USPC .......................................................... 174/262

See application file for complete search history.

(56) References Cited

U.S. PATENT DOCUMENTS 7,227,247 B2 * 6/2007 Zeng ................ H01L 23/49822 257/678
7,405,477 B1 * 7/2008 Tao .................. H01L 23/49838 257/659
7,705,246 B1 * 4/2010 Pritchard ............ H05K 1/0222 174/262
8,119,931 B1 * 2/2012 Liu ..................... H05K 1/0222 174/262
2011/0193233 A1 * 8/2011 Jiang ...................... H01L 23/50 257/773

FOREIGN PATENT DOCUMENTS

JP 2004-289094 A 10/2004

* cited by examiner

*Primary Examiner* — Michael F McAllister
(74) *Attorney, Agent, or Firm* — Volpe and Koenig, P.C.

(57) ABSTRACT

An wiring board of the present invention includes an insulating board, a pair of signal external connection pads, a pair of ground external connection pads, a pair of signal through-hole conductors, a pair of around through-hole conductors, a core ground conductor layer having an opening, a via-hole conductor, a strip-shaped wiring conductor, an upper-side signal connection conductor, and a lower-side signal connection conductor, in which the pair of the ground through-hole conductors is arranged across the opening from each other.

5 Claims, 6 Drawing Sheets

WIRING BOARD TO MOUNT A SEMICONDUCTOR ELEMENT

BACKGROUND OF THE INVENTION

1. Field of the Invention

The present invention relates to a wiring board to mount a semiconductor element such as a semiconductor integrated circuit element.

2. Description of Related Art

Conventionally, according to a small-size wiring board to mount a semiconductor element, as shown in FIG. 6, a plurality of semiconductor element connection pads 22 are arranged in a center portion of an upper surface of an insulating board 21, and a plurality of external connection pads 23 are arranged in a whole region of a lower surface of the insulating board 21. In the insulating board 21, a plurality of buildup insulating layers 25 are laminated on each of upper and lower surfaces of a core insulating plate 24. A plurality of through-holes 26 are formed in the insulating plate 24. A plurality of via-holes 27 are formed in the insulating layer 25.

A core wiring conductor 28 is deposited on the upper and lower surfaces of the insulating plate 24 and an inner surface of the through-hole 26. A buildup wiring conductor 29 is deposited on a surface of each insulating layer 25 and an inner surface of the via-hole 27. The semiconductor element connection pad 22 is formed of the upper-side buildup wiring conductor 29 deposited on an outermost layer. The external connection pad 23 is formed of the lower-side buildup wiring conductor 29 deposited on an outermost layer. The semiconductor element connection pad 22 and the external connection pad 23 are electrically connected through the wiring conductors 28 and 29. The semiconductor element connection pads 22 and the external connection pads 23 are each divided into three kinds for a signal, the ground, and a power supply.

Furthermore, a solder resist layer 30 is deposited on the upper and lower surfaces of the insulating board 21. The upper-side solder resist layer 30 has openings 30*a* to expose center portions of the semiconductor element connection pads 22. The lower-side solder resist layer 30 has openings 30*b* to expose center portions of the external connection pads 23.

The conventional wiring board includes a differential transmission line for connecting the signal semiconductor element connection pad to the signal external connection pad as disclosed in Japanese Unexamined Patent Application Publication No. 2004-289094. This differential transmission line is schematically shown in FIG. 7. FIG. 7 only shows a part of the wiring conductors 28 and 29 required to describe the differential transmission line. The differential transmission line connects a pair of signal semiconductor element connection pads 22S adjacently arranged in the center portion of the upper surface of the insulating board 21, to a pair of signal external connection pads 23S adjacently arranged in an outer periphery portion of the lower surface of the insulating board 21, through a pair of adjacently arranged current paths.

The signal semiconductor element connection pads 22S are connected to one ends of a pair of thin strip-shaped wiring conductors 31. The strip-shaped wiring conductor 31 is formed on the upper-side insulating layer 25 so as to extend from the signal semiconductor element connection pad 22S to the outer periphery portion of the insulating board 21.

The pair of the signal external connection pads 23S are arranged along an extending direction of the strip-shaped wiring conductors 31, on the lower surface of the insulating board 21 under the other ends of the strip-shaped wiring conductors 31. The other ends of the strip-shaped wiring conductors 31 and the signal external connection pads 23S are connected through a pair of signal through-hole conductors 32S, upper-side signal connection conductors 33, and lower-side signal connection conductors 34. The signal through-hole conductor 32S is formed of the wiring conductor 28 deposited in the through-hole 26. The signal connection conductors 33 and 34 are formed of the wiring conductor 29 deposited on the surface of the insulating layer 25. The signal through-hole conductor 32S, and the signal connection conductors 33 and 34 are connected through a via conductor 35 (hereinafter, referred to as the "via-hole conductor" occasionally). The via conductor 35 is formed of the wiring conductor 29 deposited in the via-hole 27. The signal through-hole conductors 32S are arranged on a perpendicular line P which is perpendicular to the extending direction of the strip-shaped wiring conductor 31 so as to be opposed across a middle point between the pair of the signal external connection pads 23S.

A core ground conductor layer 36 is arranged on almost a whole region of the lower surface of the insulating plate 24. The core ground conductor layer 36 has an opening 36*a* which collectively surrounds lower ends of the pair of the signal through-hole conductors 32S. The opening 36*a* has an oblong shape which is long in the direction of the perpendicular line P. The insulating plate 24 has a pair of ground through-hole conductors 32G provided so as to be adjacent to the pair of the signal through-hole conductors 32S. The ground through-hole conductors 32G are adjacently arranged on one side of the opening 36*a*, and their lower ends are connected to the core ground conductor layer 36.

A pair of ground external connection pads 23G is arranged on the lower surface of the insulating board 21 so as to be adjacent to the pair of the signal external connection pads 23S, along the extending direction of the strip-shaped wiring conductor 31. These ground external connection pads 23G are connected to the core ground conductor layer 36 through the via-hole conductors 35.

The upper-side insulating layer 25 has a buildup ground conductor layer (not shown) so as to be opposed to the strip-shaped wiring conductor 31, that is, arranged on the left, right, top, and bottom of the strip-shaped wiring conductor 31. The ground through-hole conductor 32G is connected to the buildup ground conductor layer through the via-hole conductor 35.

According to the conventional wiring board, when a signal is transmitted to the differential transmission line which connects the signal semiconductor element connection pad 22S to the signal external connection pad 23S, a return current flows through the ground through-hole conductor 32G so as to correspond to the signal which is transmitted in the differential transmission line from the buildup ground conductor layer provided on the left, right, top, and bottom of the strip-shaped wiring conductor 31 to the ground external connection pad 23G.

However, according to the conventional wiring board, when the signal is transmitted to the differential transmission line to connect the signal semiconductor element connection pad 22S to the signal external connection pad 23S, a small time lag is generated in transmitting the signal between the pair of the current paths to connect them. When this time lag exceeds 1.0 picosecond (ps) in a case where a transmission rate of the signal transmitted in the differential transmission line is as high as 25 Gbps or more, for example, the semiconductor element to be mounted cannot sufficiently achieve its performance, or is likely to generate a malfunction. Therefore, in the case where the transmission rate of the signal transmitted in the differential transmission line is as high as 25 Gbps or more, the time lag in signal transmission between the pair of the current paths is preferably 0.2 ps or less so that the semiconductor element to be mounted can be easily operated with sufficient performance and accuracy.

Thus, the differential transmission line to connect the signal semiconductor element connection pads 22S to the signal external connection pads 23S is designed so that the lengths of the pair of the current paths to connect them become equal to each other as much as possible. However, even when the lengths of the pair of the current paths in the differential transmission line are made equal to each other, it is extremely difficult to reduce the time lag in signal transmission between the current paths to 0.2 ps or less. Thus, the present inventor focused on and studied a return current which flows in response to the signal transmitted in the differential transmission line.

Here, FIG. 8 schematically shows flows of the return currents from the ground external connection pad 23G to the ground through-hole conductor 32G. FIG. 8 only shows a part of the wiring conductors 28 and 29 under the through-hole conductors 32S and 32G. In addition, the flow of the return current is shown by an arrow. First, the return current flows from the ground external connection pad 23G to the ground conductor layer 36 through the via-hole conductor 35. In the ground conductor layer 36, the return current flows from a portion connected to the via-hole conductor 35 to the ground through-hole conductor 32G. At this time, it is found that there is a difference in length between the current paths of the return currents on both sides provided across the perpendicular line P from each other.

It is considered that this difference in length between the current paths of the return currents affects the time lag in signal transmission between the pair of the current paths in the differential transmission line to connect the signal semiconductor element connection pad 22S to the signal external connection pad 23S. In addition, it is considered that as for the current path shown by a dotted line arrow, the opening 36*a* hinders a favorable flow of the return current, so that the return current is not likely to sufficiently flow.

SUMMARY OF THE INVENTION

An object of the present invention is to provide a wiring board capable of easily operating a semiconductor element to be mounted with sufficient performance and accuracy under the condition that a time lag in signal transmission between a pair of current paths in a differential transmission line is 0.2 ps or less.

A wiring board according to the present invention includes the following components (1) to (12), and a pair of ground through-hole conductors is arranged across an opening from each other.

(1) An insulating board formed by laminating buildup insulating layers on upper and lower surfaces of a core insulating plate.

(2) A pair of signal external connection pads adjacently arranged in a predetermined direction, on a lower surface of the insulating board.

(3) A pair of ground external connection pads arranged on the lower surface of the insulating board so as to be adjacent to the signal external connection pads and so as to be symmetrical across a perpendicular line extending through a middle point between the pair of the signal external connection pads, in a direction perpendicular to the predetermined direction.

(4) A pair of signal through-hole conductors penetrating the core insulating plate, and arranged on the perpendicular line so as to be opposed across the middle point between the pair of the signal external connection pads.

(5) A pair of ground through-hole conductors penetrating the core insulating plate, and arranged so as to be adjacent to the signal through-hole conductors.

(6) A core ground conductor layer arranged in a region including the ground external connection pad on the lower surface of the core insulating plate, having an opening for collectively surrounding the pair of the signal through-hole conductors, and connected to the ground through-hole conductors.

(7) A via-hole conductor extending from the ground external connection pad to the core ground conductor layer in the lower-side insulating layer, to connect each of the pair of the ground external connection pads to the core ground conductor layer on each of both sides provided across the perpendicular line.

(8) A pair of lower-side signal connection conductors extending from the signal external connection pads to the signal through-hole conductors in the lower-side insulating layer, to connect the pair of the signal external connection pads to the pair of the signal through-hole conductors through via conductors penetrating the lower-side insulating layer.

(9) A pair of strip-shaped wiring conductors formed on a surface of the upper-side insulating layer, and having one ends positioned in a center portion of the insulating board and other ends positioned above the vicinity of the signal through-hole conductors.

(10) A pair of upper-side signal connection conductors extending from the signal through-hole conductors to the other ends of the strip-shaped wiring conductors in the upper-side insulating layer, to connect the pair of the signal through-hole conductors to the pair of the strip-shaped wiring conductors through the via conductors penetrating the upper-side insulating layer.

(11) A buildup ground conductor layer formed on the surface of the upper-side insulating layer, arranged so as to be opposed to the pair of the strip-shaped wiring conductors, and connected to the ground through-hole conductor through the via conductor penetrating the upper-side insulating layer.

(12) An upper via-hole conductor extending from the ground through-hole conductor to the buildup ground conductor layer in the upper-side insulating layer, to connect the pair of the ground through-hole conductors to the buildup ground conductor layer.

According to the wiring board in the present invention, the pair of the ground through-hole conductors arranged so as to be adjacent to the pair of the signal through-hole conductors forming as the differential transmission line is arranged across the opening which is formed in the core ground conductor layer so as to surround the signal through-hole conductors. Therefore, it is possible to reduce a difference in length between the current paths of the return currents from the ground external connection pads provided so as to be adjacent to the signal external connection pads, to the ground through-hole conductors provided so as to be adjacent to the signal through-hole conductors, and the return current can smoothly flow. As a result, it is possible to provide the wiring board capable of reducing the time lag in signal transmission between the pair of the current paths in the differential transmission line, and favorably operating the semiconductor element to be mounted.

DESCRIPTION OF THE PREFERRED EMBODIMENTS

Figure 1:
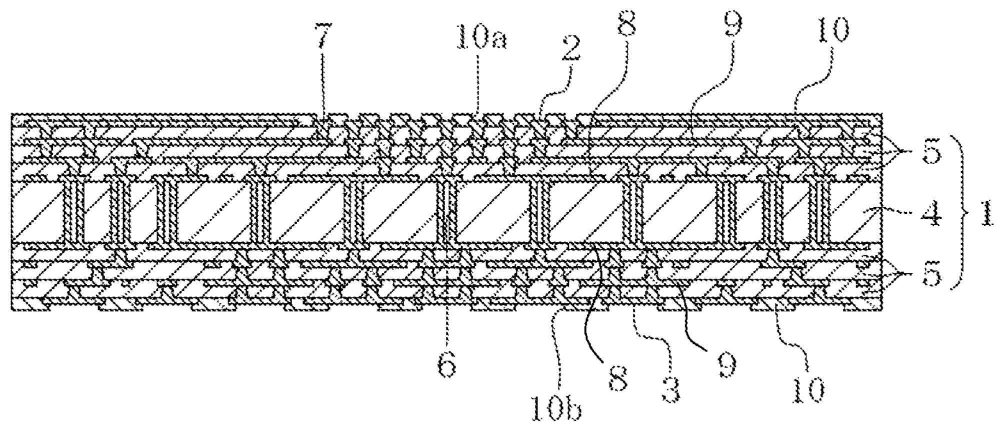
FIG. 1 is a schematic cross-sectional view showing one embodiment of a wiring board according to the present invention.
Figure 2:
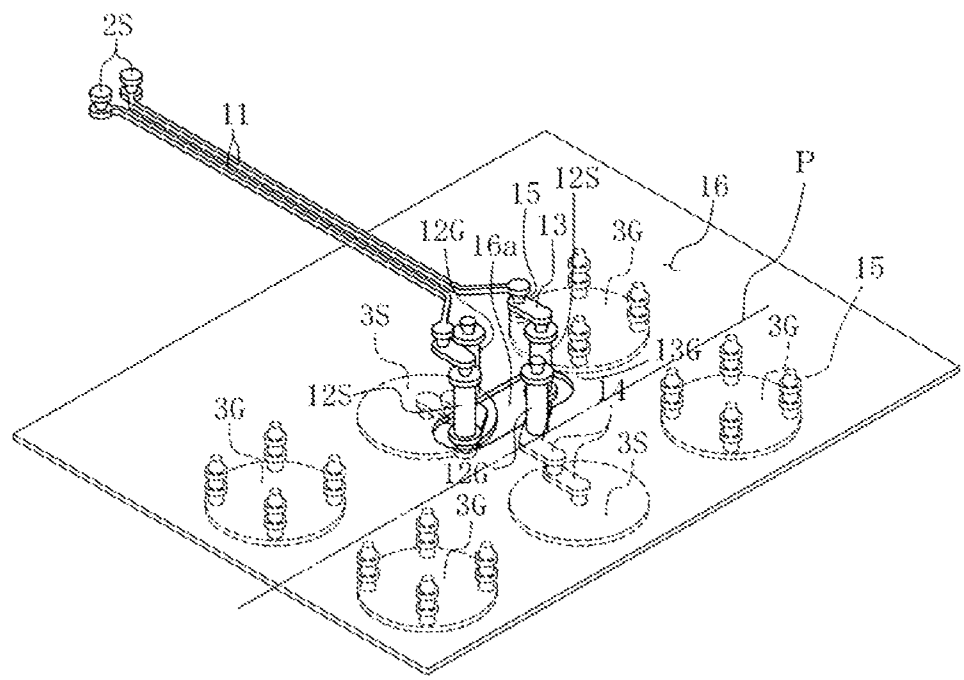
FIG. 2 is a perspective view of a substantial part showing only a part of wiring conductors of the wiring board shown in FIG. 1.

Next, one embodiment of the wiring board according to the present invention will be described with reference to FIGS. 1 and 2. According to the wiring board of the present invention, as shown in FIG. 1, a plurality of semiconductor element connection pads 2 are arranged in a center of an upper surface of an insulating board 1, and a plurality of external connection pads 3 are arranged in a whole region of a lower surface of the insulating board 1.

The insulating board 1 has a structure in which three buildup insulating layers 5 are laminated on each of upper and lower surfaces of a core insulating plate 4. The insulating plate 4 is formed by impregnating a glass textile which is woven with glass fiber bundles vertically and horizontally, with a thermosetting resin such as epoxy resin or bismaleimide triazine resin. A plurality of through-holes 6 are formed in the insulating plate 4. A thickness of the insulating plate 4 is about 0.1 mm to 2 mm. A diameter of the through-hole 6 is about 0.1 mm to 0.3 mm.

The insulating layer 5 is formed of an insulating material prepared by dispersing 30% to 70% by mass of inorganic insulating filler such as silicon oxide powder, in a thermosetting resin such as epoxy resin. A plurality of via-holes 7 are formed in the insulating layer 5. A thickness of the insulating layer 5 is about 20 μm to 60 μm. A diameter of the via-hole 7 is about 30 μm to 100 μm.

A core wiring conductor 8 is deposited on the upper and lower surfaces of the insulating plate 4 and an inner surface of the through-hole 6. A buildup wiring conductor 9 is deposited on a surface of the insulating layer 5 and inner surface of the via-hole 7. A thickness of the core wiring conductor 8 is about 10 μm to 30 μm. The core wiring conductor 8 is made of copper foil or a copper-plated layer on the upper and lower surfaces of the insulating plate 4, and made of a copper-plated layer in the through-hole 6. The buildup wiring conductor 9 is made of a copper-plated layer. A thickness of the buildup wiring conductor 9 is about 5 μm to 25 μm. The through-hole 6 covered with the core wiring conductor 8 is filled with a resin.

The semiconductor element connection pad 2 is formed of the buildup wiring conductor 9 deposited on the outermost layer on the upper-side. A diameter of the semiconductor element connection pad 2 is about 50 μm to 100 μm. The semiconductor element connection pads 2 are arranged in a grid-like shape at a pitch of 100 μm to 200 μm. The external connection pad 3 is formed of the buildup wiring conductor 9 deposited on the outermost layer on the lower-side. A diameter of the external connection pad 3 is about 300 μm to 1000 μm. The external connection pads 3 are arranged in a grid-like shape at a pitch of 500 μm to 2000 μm. The semiconductor element connection pad 2 and the external connection pad 3 are electrically connected through the wiring conductors 8 and 9. The semiconductor element connection pads 2 and the external connection pads 3 are each divided into three kinds for a signal, the ground, and a power supply.

Furthermore, a solder resist layer 10 is deposited on the upper and lower surfaces of the insulating board 1. The upper-side solder resist layer 10 has openings 10*a* formed so as to expose center portions of the semiconductor element connection pads 2. The lower-side solder resist layer 10 has openings 10*b* formed so as to expose center portions of the external connection pads 3. The solder resist layer 10 is formed of a thermosetting resin such as an acrylic-modified epoxy resin.

The wiring board in the present invention is provided with a differential transmission line to connect the signal semiconductor element connection pad 2 to the signal external connection pad 3. The differential transmission line is schematically shown in FIG. 2. FIG. 2 only shows a part of the wiring conductors 8 and 9 required to describe the differential transmission line. The differential transmission line connects a pair of signal semiconductor element connection pads 2S adjacently arranged in the center portion of the upper surface of the insulating board 1 to a pair of signal external connection pads 3S adjacently arranged in an outer periphery portion of the lower surface of the insulating board 1.

The pair of the signal semiconductor element connection pads 2S is connected to one ends of a pair of thin strip-shaped wiring conductors 11. The strip-shaped wiring conductor 11 is formed on the upper-side insulating layer 5 so as to extend from the signal semiconductor element connection pad 2S to the outer periphery portion of the insulating board 1. In the pair of the strip-shaped wiring conductors, a distance between each end increases in width with respect to both ends, and parts other than the both ends are closely parallel to each other. A width of the strip-shaped wiring conductor 11 is about 10 μm to 30 μm. A distance between the strip-shaped wiring conductors 11 is about 20 μm to 75 μm in the parallel portions. Characteristic impedance of the strip-shaped wiring conductor 11 in the parallel portion is adjusted so as to show roughly 100Ω.

The pair of the signal external connection pads 3S are adjacently arranged along the extending direction of the strip-shaped wiring conductor 11 on the lower surface of the insulating board 1 in the other end of the strip-shaped wiring conductor 11. The other end of the strip-shaped wiring conductor 11 is connected to the signal external connection pad 3S through a signal through-hole conductor 12S, an upper-side signal connection conductor 13, and a lower-side signal connection conductor 14. The signal connection conductors 13 and 14 are each formed of the buildup wiring conductor 9 deposited on the surface of the insulating layer 5. The signal through-hole conductor 12S is formed of the core wiring conductor 8 deposited in the through-hole 6. These members are connected through a via conductor 15. The via conductor 15 is formed of the buildup wiring conductor 9 deposited in the via-hole 7.

The signal through-hole conductors 12S are arranged on a perpendicular line P extending in a direction perpendicular to the extending direction of the strip-shaped wiring conductor 11 so as to be opposed across a middle point between the pair of the signal external connection pads 3S. That is, the signal through-hole conductors 12S are arranged above a core ground conductor layer 16 which will be described below, that is, arranged on the same side as the strip-shaped wiring conductor 11. A distance between the signal through-hole conductors 12S is about 300 μm to 600 μm.

The core ground conductor layer 16 is arranged in almost a whole region of the lower surface of the insulating plate 4. The ground conductor layer 16 has an opening 16*a* formed so as to collectively surround lower ends of the pair of the signal through-hole conductors 12S. The opening 16*a* has an oblong shape which is long in the direction of the perpendicular line P. The opening 16*a* has a long diameter of 400 μm to 1200 μm, and a short diameter of 200 μm to 500 μm.

Furthermore, at least one pair of ground external connection pads 3G is arranged on the lower surface of the insulating board 1 so as to be symmetrical across the perpendicular line P and adjacent to the pair of the signal external connection pads 3S. These ground external connection pads 3G are connected to the core ground conductor layer 16 through the via-hole conductors 15. The four via-hole conductors 15 are connected to the one ground external connection pad 3G.

A pair of ground through-hole conductors 12G is provided in the insulating plate 4 so as to be adjacent to the pair of the signal through-hole conductors 12S. The ground through-hole conductors 12G are arranged across the opening 16*a* so as to be symmetrical across almost a middle point between the pair of the signal through-hole conductors 12S, in the extending direction of the strip-shaped wiring conductor 11, and their lower ends are connected to the core ground conductor layer 16. A distance between the ground through-hole conductor 12G and the signal through-hole conductor 12S is about 100 μm to 300 μm.

A buildup ground conductor layer (not shown) is arranged on the upper-side insulating layer 5 so as to be opposed to the strip-shaped wiring conductor 11, that is, arranged on the left, right, top, and bottom of the strip-shaped wiring conductor 11. The around through-hole conductor 12G is connected to the buildup ground conductor layer through the via-hole conductor 15.

According to the wiring board in the present invention, when a signal is transmitted to the differential transmission line which connects the signal semiconductor element connection pad 2S and the signal external connection pad 3S, a return current flows through the ground through-hole conductor 12G so as to correspond to the signal transmitted in the differential transmission line from the buildup ground conductor layer provided so as to be opposed to the strip-shaped wiring conductor 11, to the ground external connection pad 3G.

Figure 3:
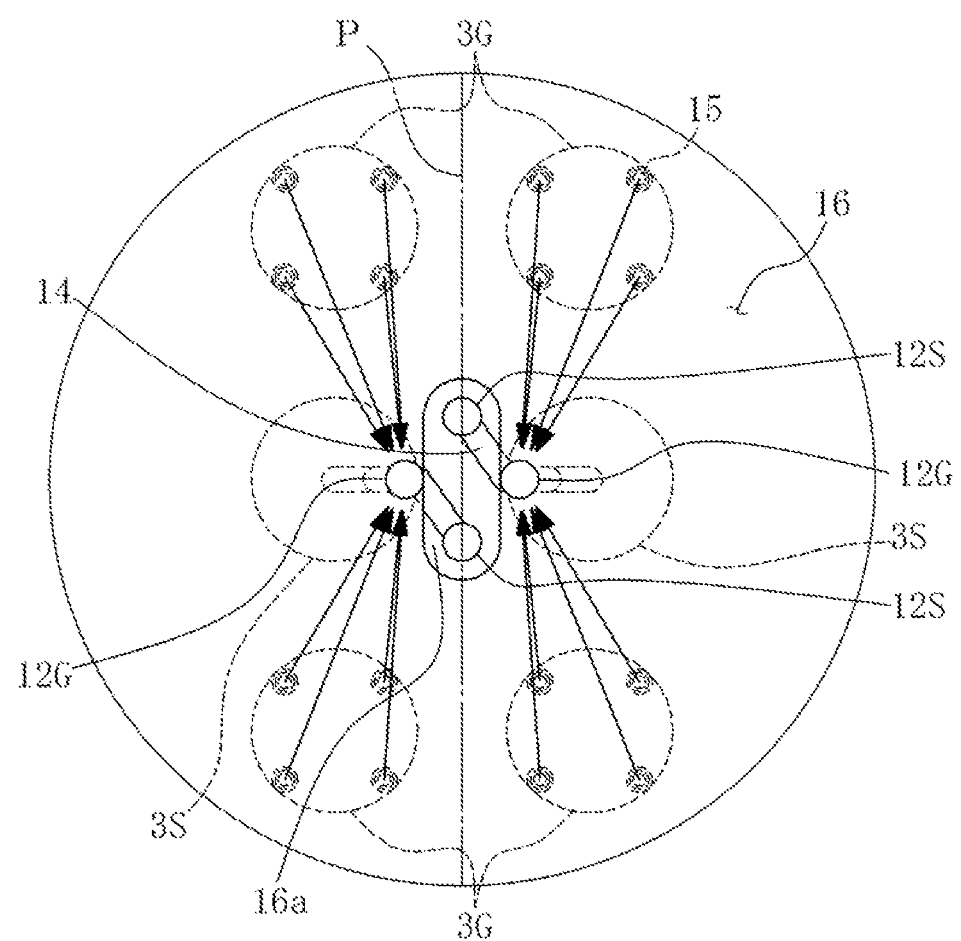
FIG. 3 is a schematic plan view of a substantial part to show flows of return currents in the wiring board shown in FIG. 2.

Here, FIG. 3 schematically shows a flow of the return current from the ground external connection pad 3G to the ground through-hole conductor 12G. FIG. 3 shows only a part of the wiring conductors 8 and 9 under the through-hole conductors 12S and 12G, and shows the flow of the return current with an arrow. First, the return current flows from the ground external connection pad 3G to the ground conductor layer 16 through the via-hole conductor 15. In the ground conductor layer 16, the return current flows from the portion connected to the via-hole conductor 15 to the ground through-hole conductor 12G. At this time, lengths of current paths of the return currents are the same on both sides provided across the perpendicular line P.

Therefore, it is possible to reduce a difference in length between the current paths of the return currents, which affects a time lag in signal transmission. In addition, the opening 16*a* does not hinder the favorable flow of the return current in the current path from the via-hole conductor 15 to the closest ground through-hole conductor 12G. Therefore, the signal can be transmitted to the differential transmission line with high accuracy and efficiency. As a result, the wiring board in the present invention can favorably operate the semiconductor element to be mounted.

Figure 4:
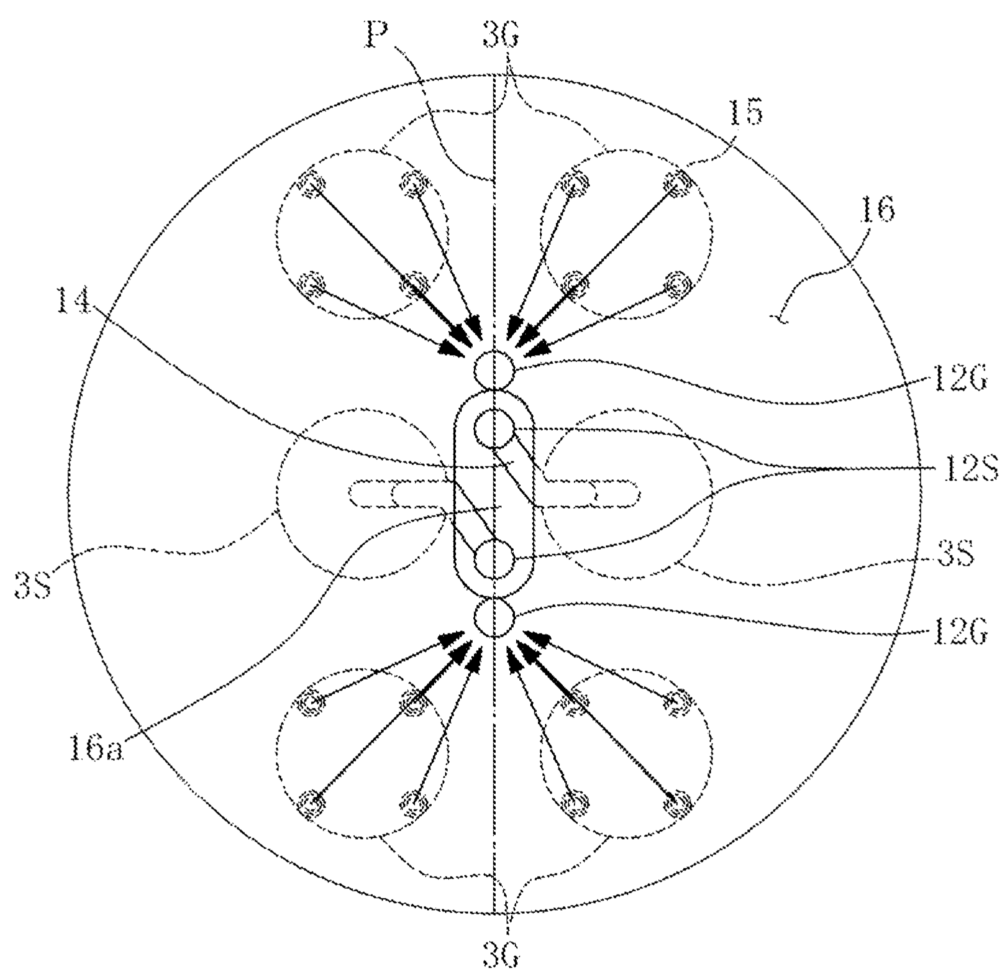
FIG. 4 is a schematic plan view of a substantial part to show flows of return currents in another embodiment of the wiring board according to the present invention.

Next, another embodiment of the wiring board according to the present invention will be described. FIG. 4 is a schematic view similar to FIG. 3, and the same part as in FIG. 3 is marked with the same reference characters, and its detailed description is omitted.

A wiring board shown in FIG. 4 differs from the wiring board shown in FIG. 3 in positions of the ground through-hole conductors 12G. In FIG. 4, the ground through-hole conductors 12G are arranged across the opening 16*a* so as to be symmetrical in the direction perpendicular to the direction from the center portion toward the outer periphery portion of the insulating board (extending direction of the strip-shaped wiring conductor 11). That is, the ground through-hole conductors 12G and the signal through-hole conductors 12S are arranged on the same straight line. In this case also, the lengths of the current paths of the return currents are the same on both sides provided across the perpendicular line P.

Therefore, it is possible to reduce a difference in length between the current paths of the return currents, which affects a time lag in signal transmission. In addition, the opening 16*a* does not hinder the favorable flow of the return current in the current path from the via-hole conductor 15 to the closest ground through-hole conductor 12G. Therefore, the signal can be transmitted to the differential transmission line with high accuracy and efficiency. As a result, the wiring board shown in FIG. 4 can favorably operate the semiconductor element to be mounted.

Figure 5:
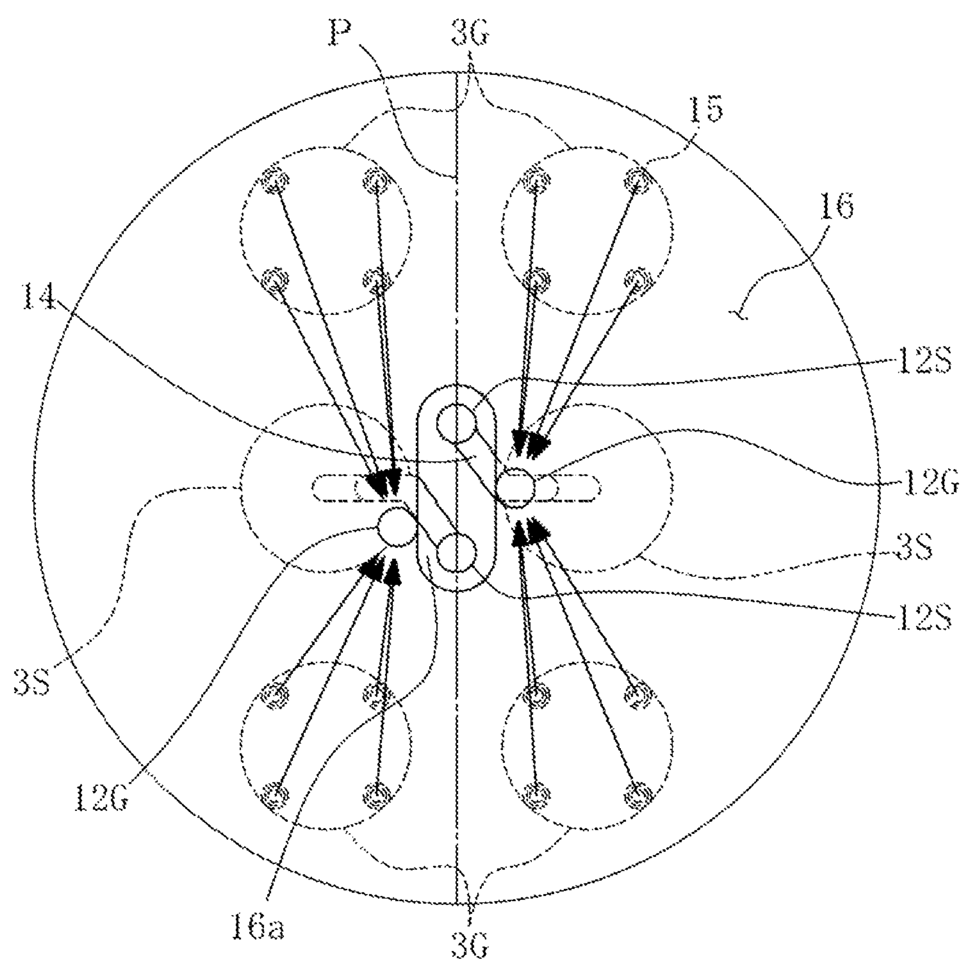
FIG. 5 is a schematic plan view of a substantial part to show flows of return currents in still another embodiment of the wiring board according to the present invention.
Figure 6:
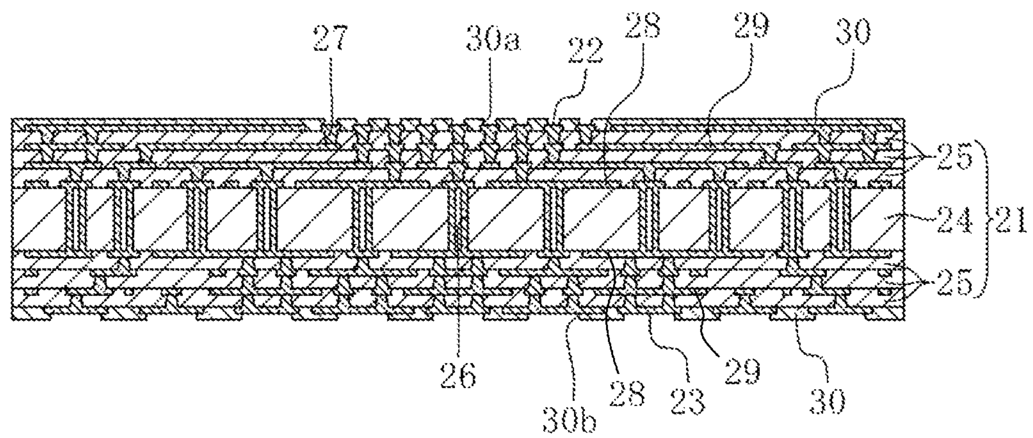
FIG. 6 is a schematic cross-sectional view showing a conventional wiring board.
Figure 7:
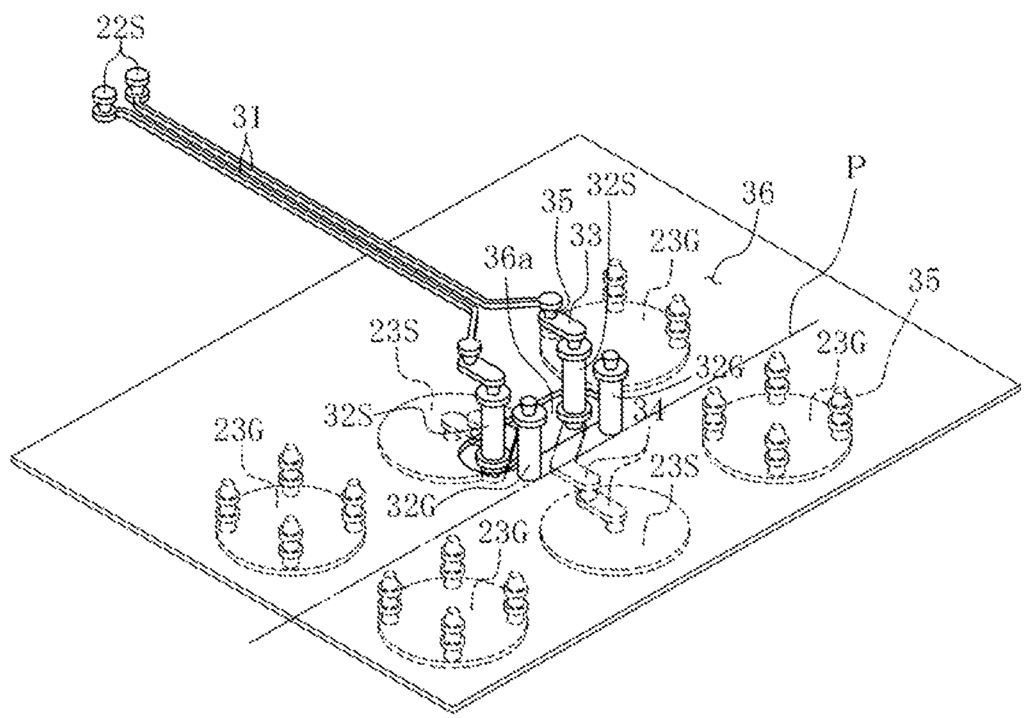
FIG. 7 is a perspective view of a substantial part showing only a part of wiring conductors of the conventional wiring board shown in FIG. 6.

Next, still another embodiment of the wiring board according to the present invention will be described. FIG. 5 is a schematic view similar to FIGS. 3 and 4. The same part as in FIGS. 3 and 4 are marked with the same reference characters, and its detailed description is omitted.

According to a wiring board shown in FIG. 5, the ground through-hole conductors 12G are arranged across the opening 16*a*, but they are not symmetrically arranged across the opening 16*a*. In this case, the lengths of the current paths of the return currents are not equal on both sides arranged across the perpendicular line P. But the difference in length between the current paths of the return currents on both sides arranged across the perpendicular line P is slight.

Therefore, it is possible to reduce a difference in length between the current paths of the return currents, which affects a time lag in signal transmission. Furthermore, by slightly displacing one of the ground through-hole conductors 12G from the symmetrical position, the time lag in signal transmission can be adjusted between the pair of the current paths in the differential transmission line to connect the signal semiconductor element connection pad 2S to the external connection pad 3S. In addition, the opening 16*a* does not hinder the favorable flow of the return current in the current path from the via-hole conductor 15 to the closest ground through-hole conductor 12G. Therefore, the signal can be transmitted to the differential transmission line with high accuracy and efficiency. As a result, the wiring board shown in FIG. 5 can also favorably operate the semiconductor element to be mounted.

Figure 8:
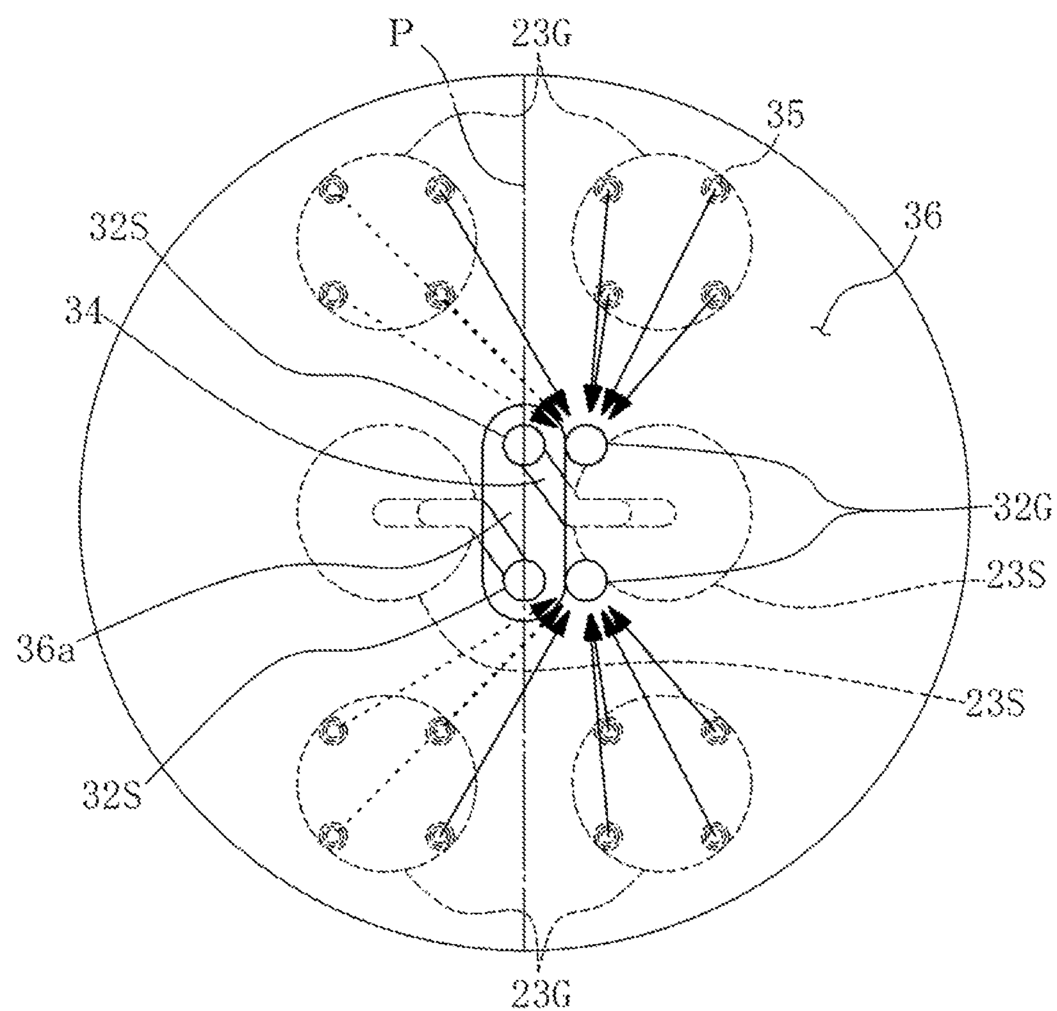
FIG. 8 is a schematic plan view of a substantial part to show flows of return currents in the conventional wiring board shown in FIG. 7.

Furthermore, as a result of analysis by the present inventor with an electromagnetic field simulator, the time lag in signal transmission between the pair of the current paths in the differential transmission line is 0.23 ps in an analysis model corresponding to the conventional wiring board shown in FIG. 8.

Meanwhile, according to an analysis model corresponding to the wiring board in the present invention shown in FIG. 3, the time lag in signal transmission between the pair of the current paths in the differential transmission line is 0.11 ps. According to an analysis model corresponding to the wiring board in the present invention shown in FIG. 4, the time lag in signal transmission between the pair of the current paths in the differential transmission line is 0.14 ps. According to an analysis model corresponding to the wiring board in the present invention shown in FIG. 5, the time lag in signal transmission between the pair of the current paths in the differential transmission line can attain 0.022 ps. Thus, according to the present invention, it is possible to provide the wiring board capable of easily operating the semiconductor element to be mounted with sufficient performance and accuracy under the condition that the time lag in signal transmission between the pair of the current paths in the differential transmission line can be 0.2 ps or less.

The present invention is not limited to the above embodiments, and variously modified within the scope described in claim. According to the wiring boards shown in FIGS. 1 to 5, the opening 16*a* formed in the core ground conductor layer 16 has an oblong shape. However, the shape of the opening 16*a* is not limited as long as the pair of the signal through-hole conductors 12S can be collectively surrounded, and it may be shaped like a rectangle or a circle.

What is claimed is:

1. A wiring board comprising:

an insulating board formed by laminating buildup insulating layers on upper and lower surfaces of a core insulating plate;

a pair of signal external connection pads adjacently arranged in a predetermined direction, on a lower surface of the insulating board;

a pair of ground external connection pads arranged on the lower surface of the insulating board so as to be adjacent to the signal external connection pads and so as to be symmetrical across a perpendicular line extending through a middle point between the pair of the signal external connection pads, in a direction perpendicular to the predetermined direction;

a pair of signal through-hole conductors penetrating the core insulating plate, and arranged on the perpendicular line so as to be opposed across the middle point between the pair of the signal external connection pads;

a pair of ground through-hole conductors penetrating only the same core insulating plate which is penetrated by the signal through-hole conductors, and arranged so as to be adjacent to the signal through-hole conductors;

a core ground conductor layer arranged in a region including the ground external connection pad on the lower surface of the core insulating plate, having an opening for collectively surrounding the pair of the signal through-hole conductors, and connected to the ground through-hole conductors;

a via-hole conductor extending from the ground external connection pad to the core ground conductor layer in the lower-side insulating layer, to connect each of the pair of the ground external connection pads to the core ground conductor layer on each of both sides provided across the perpendicular line;

a pair of lower-side signal connection conductors extending from the signal external connection pads to the signal through-hole conductors in the lower-side insulating layer, to connect the pair of the signal external connection pads to the pair of the signal through-hole conductors through via conductors penetrating the lower-side insulating layer;

a pair of strip-shaped wiring conductors formed on a surface of the upper-side insulating layer, and having one ends positioned in a center portion of the insulating board and other ends positioned above the vicinity of the signal through-hole conductors;

a pair of upper-side signal connection conductors extending from the signal through-hole conductors to the other ends of the strip-shaped wiring conductors in the upper-side insulating layer, to connect the pair of the signal through-hole conductors to the pair of the strip-shaped wiring conductors through the via conductors penetrating the upper-side insulating layer;

a buildup ground conductor layer formed on the surface of the upper-side insulating layer, arranged so as to be opposed to the pair of the strip-shaped wiring conductors, and connected to the ground through-hole conductor through the via conductor penetrating the upper-side insulating layer; and an upper via-hole conductor extending from the ground through-hole conductor to the buildup ground conductor layer in the upper-side insulating layer, to connect the pair of the ground through-hole conductors to the buildup ground conductor layer, wherein the pair of the ground through-hole conductors is arranged across the opening from each other.

2. The wiring board according to claim 1, wherein the pair of the ground through-hole conductors is arranged across the opening so as to be symmetrical in a direction from a center portion to an outer periphery portion of the insulating board.

3. The wiring board according to claim 2, wherein the pair of the ground through-hole conductors is arranged across a middle point between the pair of the signal through-hole conductors.

4. The wiring board according to claim 1, wherein the pair of the ground through-hole conductors is arranged across the opening so as to be asymmetrical in a direction from a center portion to an outer periphery portion of the insulating board.

5. The wiring board according to claim 1, wherein the pair of the ground through-hole conductors is arranged across the opening so as to be aligned with the pair of the signal through-hole conductors.

* * * * *